United States Patent [19]
Yeh

[11] Patent Number: 5,927,385
[45] Date of Patent: Jul. 27, 1999

[54] COOLING DEVICE FOR THE CPU OF COMPUTER

[76] Inventor: Ming Hsin Yeh, No. 25, Hsi-Pu 2rd St., Hsi-pu Tsun, Kuei-Jen Hsiang, Tainan Hsien, Taiwan

[21] Appl. No.: 09/010,502

[22] Filed: Jan. 21, 1998

[51] Int. Cl.[6] ...................................................... H05K 7/20
[52] U.S. Cl. ........................ 165/80.3; 165/121; 165/185; 361/697
[58] Field of Search .................................. 165/80.3, 121, 165/185; 361/695, 697, 704, 690; 174/16.3; 257/722

[56] References Cited

U.S. PATENT DOCUMENTS

| | | | |
|---|---|---|---|
| 5,409,352 | 4/1995 | Lin | 165/80.3 |
| 5,582,240 | 12/1996 | Widmayer | 165/80.3 |
| 5,661,638 | 8/1997 | Mira | 361/697 |
| 5,689,404 | 11/1997 | Katsui | 361/697 |
| 5,782,292 | 7/1998 | Ogawara et al. | 165/80.3 |
| 5,835,347 | 11/1998 | Chu | 361/697 |
| 5,864,464 | 1/1999 | Lin | 361/697 |

*Primary Examiner*—Leonard Leo
*Attorney, Agent, or Firm*—Rosenberg, Klein & Bilker

[57] ABSTRACT

The present invention relates to a cooling device for the CPU of computer, which is die-casting organic whole, basing on a base plate there is a set of radial radiating fins, the feature of the present invention is to build a raised heat block, lower than the radial radiating fins, upon the center of the radial radiating fins, and several equiangular guide radiation ribs are formed on the topside of the heat block laying from the center to the rim. In practising, the heat block absorbs more heat and by means of the guide radiation ribs lead and force splitting the strong cool air flow into branch currents through the radial radiating fins speedily to increase the efficiency of heat exchange.

2 Claims, 3 Drawing Sheets

COOLING DEVICE FOR THE CPU OF COMPUTER

BACKGROUND OF THE INVENTION

1. Field of the Invention

The present invention relates to a cooling device for the CPU of computer, more particularly to a cooling device which is formed in an organic whole by die-casting, and having a thicker heat block formed the guide radiation fins on the topside.

2. Description of Prior Art

In accordance with the computer so far, most of them are attached a cooling device on the CPU co-operating with a fan for dissipating heat. For the convenience of manufacturing in large scale, a cooling device with parallel radiating fins in an uniform gauge is formed with aluminium alloy by die-casting, and located between the fan and the topside of the CPU. Along with the improvement of the operation speed of the CPU, the higher speed is operated, the more heat is generated. For improving the cooling efficiency, some manufacturers cut several crossing grooves through the parallel radiating fins for increasing the radiating area and accelerating the dissipate heat air. On the other side, for fixing on the main board of the computer, several securing holes are built on the cooling device. But there are some shortcomings existing in the conventional construction as follows:

1. The machining like cutting through the crossing grooves and punching the securing holes will cause the bottom surface of the A-alloy cooling device distortion so as to generate a gap between the contacting surfaces of the cooling device and the CPU, further to reduce the efficiency of heat exchange;
2. Due to vertical crossing state between the parallel radiating fins and the crossing grooves, as forced cooling by the fan, the flowing heat air with high speed is bounded in orientation greatly so as to create eddy current and burble, further to affect the cooling result;
3. Cooling first should conduct heat to the cooling device, then lead to the radiating fins, finally in the radiating fins the heat is transferred into the air; so the thermal absorption of the base plate of cooling device directly influences the efficiency of heat exchange of the cooling device; the thickness of the conventional cooling devices mostly are too thin to transfer enough heat in a certain period.

OBJECTS AND SUMMARY OF THE INVENTION

It is therefore a main object of the present invention to provide a cooling device in which the heat air flow out fluently and smoothly. Taking the advantages of a certain guide angle kept by all the guide radiation ribs and the heat block, the object can be achieved.

It is an other object of the present invention to provide a cooling device formed by die-casting with A-alloy in one step without other final machining.

This object is achieved by an improved structure of cooling device, in which a raised thicker heat block built on the centre of the base plate, and several equiangular guide radiation ribs are formed on the top side of heat block, and many radial radiating fins higher than the radiation ribs are set upon the base plate around the edge of the heat block. So that the thicker heat block can absorb more heat and transfer the heat to all the radiating fins of the cooling device, meanwhile, by means of the guide radiation ribs to split and lead the strong cool air flow into the radial radiating fins, the heat air collected round the heat block will be carried away speedily for meeting the high cooling efficiency requirement.

DETAILED DESCRIPTION OF PREFERRED EMBODIMENTS

Figure 1:
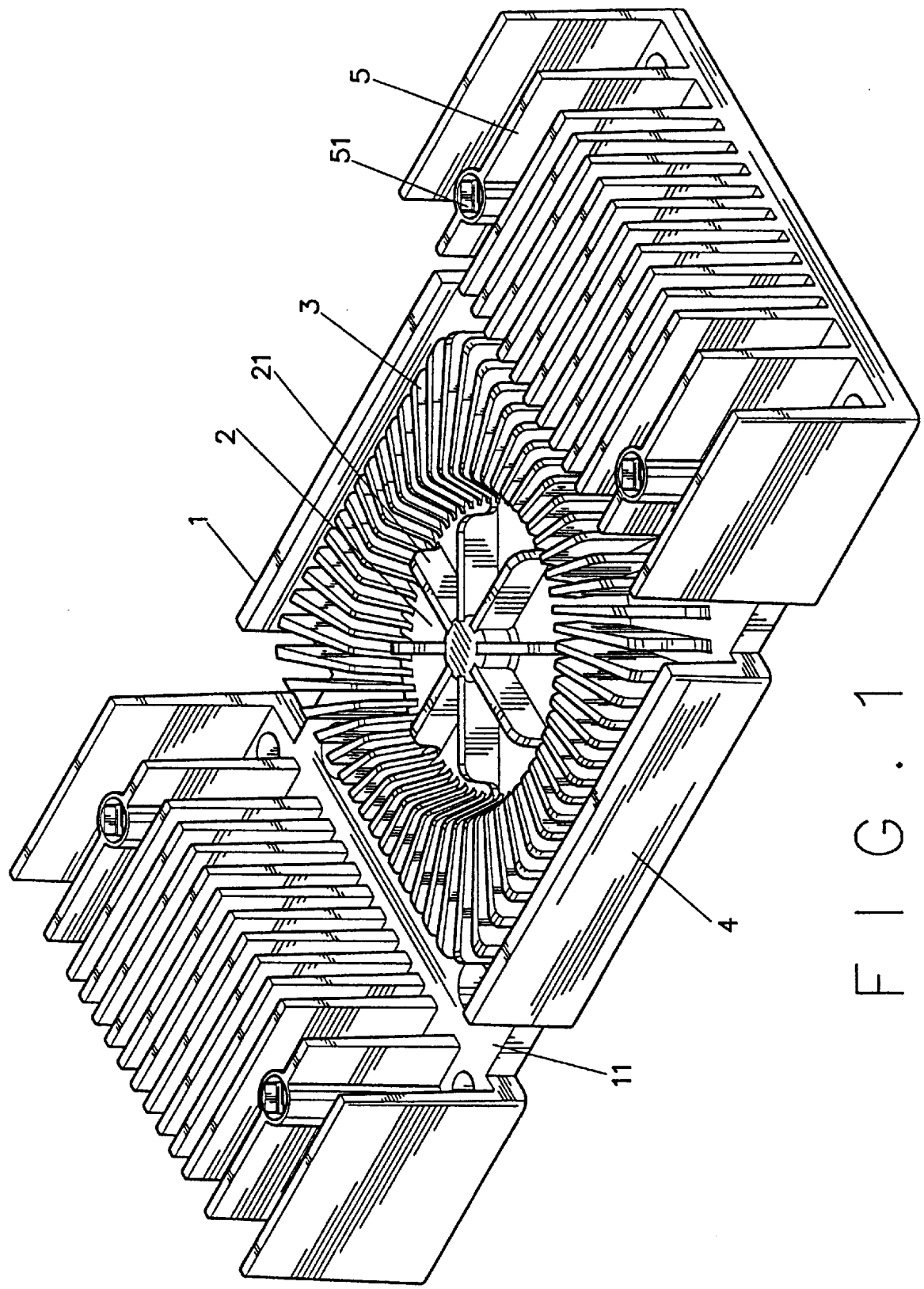
FIG. 1 is a solid view of the present invention.
Figure 2:
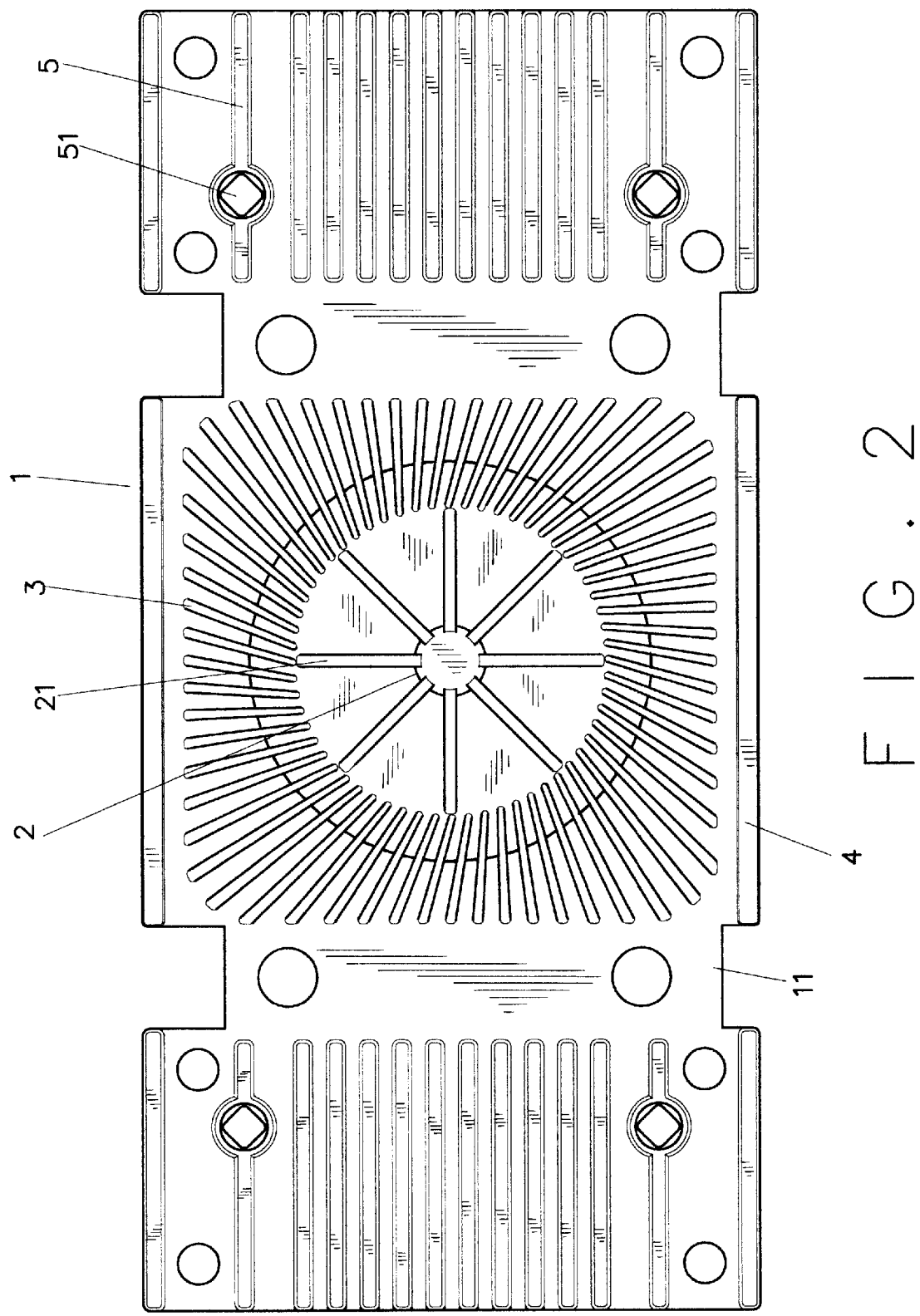
FIG. 2 is a top side view of the present invention.

Referring to FIG. 1 and FIG. 2, the present invention provides a cooling device 1 which is a die-casting organic whole, wherein a raised heat block 2 built upon the centre of the base plate 11 with several equiangular guide radiation ribs 21 formed at the topside laying from the centre to the rim; along the elongation line of the diameter of the heat block 2, many radial radiating fins 3 higher than the guide radiation ribs 21 are set upon round the edge of the heat block 2 with a certain angle; and at the both front and back sides of the radial radiating fins 3 two plate-fins 4 are formed, and two sets of parallel radiating fins 5 higher than the plate-fins 4 slightly are arranged at the both sides of the heat block 2 separately in the same direction with the plate-fins 4; and on the proper positions several retaining holes 51 are set upon the parallel radiating fins 5.

Figure 3:
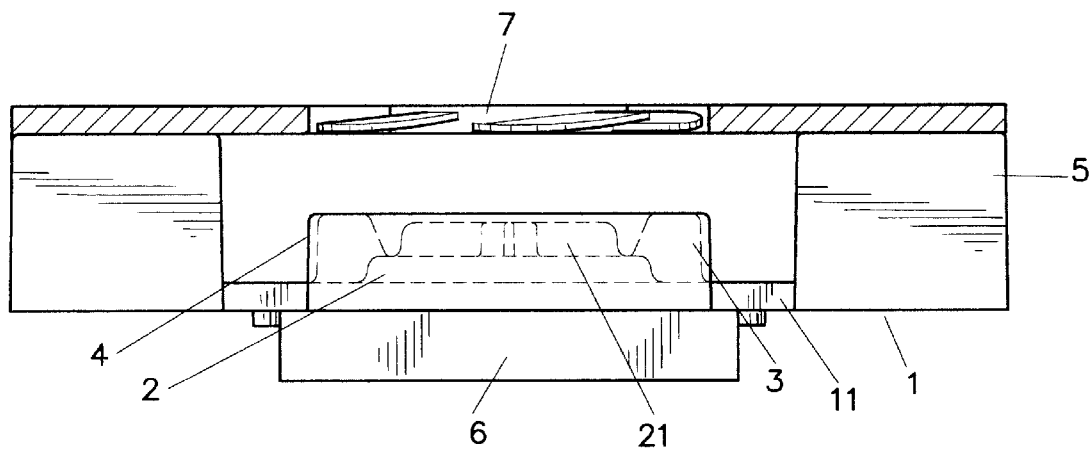
FIG. 3 is a side view showing the combination with the fan and CPU of the present invention.

In practising, co-operating with a CPU 6 and a fan 7, as shown on FIG. 3, the cooling device 1 is stuck on the top surface of the CPU 6 with the bottom side of the heat block 2, by the retaining holes 51 the fan 7 is secured on the parallel radiating fins 5 above the heat block 2 rightly keeping a certain space away with it. When the CPU 6 is working and generating high heat, the thicker heat block 2 can absorb more heat via the contacting surface, and conduct to the guide radiation ribs 21, the radial radiating fins 3, the plate-fins 4 and radiating fins 5. By means of the running fan 7, the high speed flowing cool air blows on the heat block 2 having the highest temperature, in this case the guide radiation ribs 21 not only provide a first radiating effect, and also split the strong cool air flow into several branch currents and lead into the radial radiating fins 3 around the heat block 2 to force heat exchange and keep the air current flowing smoothly to the outside.

I claim:

1. A cooling device for the CPU of a computer, comprising:

a base plate having a central portion and two side portions, said side portions extending in opposite directions from said central portion of said base plate and integrally formed therewith, said central portion having a bottom, a front edge, and a rear edge;

a pair of substantially parallel plate fins extending upwardly from said bottom of said central portion along said front and rear edges thereof;

a plurality of first radiating fins disposed on each of said two side portions of said base plate and extending thereon in substantially parallel spaced relationship, said first radiating fins being disposed in substantially parallel relationship with said plate fins;

a heat block positioned centrally in said central portion;

a plurality of guide radiation ribs radially extending from said heat block in angularly spaced relationship;

a plurality of substantially identical second radiating fins disposed in angularly spaced relationship around said guide radiation ribs and extending upwardly from said bottom of said central portion, each second radiating fin having a flat body and a linear upper edge, said first radiating fins having a greater height than a height of said plate fins, said second radiating fins having a greater height than a height of said guide radiation fins; and, retaining means disposed on each of said side portions.

2. The cooling device as recited in claim 1 further comprising a fan, said fan being supported on respective upper edges of said first radiating fins and removably secured thereto by said retaining means, thereby being maintained in spaced relationship above said second radiating fins.

* * * * *